United States Patent
Meyer et al.

(10) Patent No.: US 10,340,353 B2
(45) Date of Patent: Jul. 2, 2019

(54) EPITAXIAL METALLIC TRANSITION METAL NITRIDE LAYERS FOR COMPOUND SEMICONDUCTOR DEVICES

(71) Applicants: David J. Meyer, Fairfax, VA (US); Brian P. Downey, Alexandria, VA (US); Douglas S. Katzer, Alexandria, VA (US)

(72) Inventors: David J. Meyer, Fairfax, VA (US); Brian P. Downey, Alexandria, VA (US); Douglas S. Katzer, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/813,460

(22) Filed: Jul. 30, 2015

(65) Prior Publication Data
US 2016/0035851 A1 Feb. 4, 2016

Related U.S. Application Data

(60) Provisional application No. 62/031,901, filed on Aug. 1, 2014.

(51) Int. Cl.
*H01L 29/45* (2006.01)
*H01L 21/02* (2006.01)
*H01L 21/04* (2006.01)

(52) U.S. Cl.
CPC .......... *H01L 29/45* (2013.01); *H01L 21/0254* (2013.01); *H01L 21/02378* (2013.01);
(Continued)

(58) Field of Classification Search
CPC ......... H01L 21/02378; H01L 21/02381; H01L 21/02389; H01L 21/0242; H01L 21/02491;
(Continued)

(56) References Cited

U.S. PATENT DOCUMENTS 3,929,527 A 12/1975 Chang et al.
4,492,971 A 1/1985 Bean et al.
(Continued)

OTHER PUBLICATIONS

Rawat et al., "Growth of TiN/GaN metal/semiconductor multilayers by reactive pulsed laser deposition," J. Appl. Phys., 100, 064901 (2006).
(Continued)

*Primary Examiner* — Dale E Page
*Assistant Examiner* — Quovaunda Jefferson
(74) *Attorney, Agent, or Firm* — US Naval Research Laboratory; Joslyn Barritt

(57) ABSTRACT

A method for integrating epitaxial, metallic transition metal nitride (TMN) layers within a compound semiconductor device structure. The TMN layers have a similar crystal structure to relevant semiconductors of interest such as silicon carbide (SiC) and the Group III-Nitrides (III-Ns) such as gallium nitride (GaN), aluminum nitride (AlN), indium nitride (InN), and their various alloys. Additionally, the TMN layers have excellent thermal stability and can be deposited in situ with other semiconductor materials, allowing the TMN layers to be buried within the semiconductor device structure to create semiconductor/metal/semiconductor heterostructures and superlattices.

16 Claims, 4 Drawing Sheets

(52) U.S. Cl.
CPC .. *H01L 21/02458* (2013.01); *H01L 21/02491* (2013.01); *H01L 21/02505* (2013.01); *H01L 21/02529* (2013.01); *H01L 21/0485* (2013.01); *H01L 21/0495* (2013.01); *H01L 29/452* (2013.01)

(58) Field of Classification Search
CPC ........... H01L 21/02529; H01L 21/0254; H01L 21/28568
See application file for complete search history.

(56) References Cited

U.S. PATENT DOCUMENTS

| | | | |
|---|---|---|---|
| 4,502,932 A | 3/1985 | Kline et al. | |
| 5,010,037 A | 4/1991 | Lin et al. | |
| 5,075,755 A | 12/1991 | Sands | |
| 5,449,561 A | 9/1995 | Golding et al. | |
| 5,753,040 A | 5/1998 | Cho | |
| 6,239,005 B1 | 5/2001 | Sumiya et al. | |
| 6,414,738 B1* | 7/2002 | Fujikawa | G02F 1/13454 257/764 |
| 6,929,867 B2 | 8/2005 | Armitage et al. | |
| 2001/0050376 A1* | 12/2001 | Shibata | H01L 31/03042 257/190 |
| 2004/0012015 A1* | 1/2004 | Saxler | H01L 21/0237 257/18 |
| 2005/0133816 A1* | 6/2005 | Fan | H01L 29/66462 257/190 |
| 2007/0101932 A1* | 5/2007 | Schowalter | C30B 11/003 117/84 |
| 2009/0184398 A1* | 7/2009 | Choi | H01L 21/02378 257/615 |
| 2009/0230555 A1 | 9/2009 | Chapple-Sokol et al. | |
| 2010/0037942 A1* | 2/2010 | Borland | H01B 1/06 136/255 |
| 2010/0176369 A2 | 7/2010 | Oliver et al. | |
| 2010/0184273 A1 | 7/2010 | Choi et al. | |
| 2010/0216306 A1 | 8/2010 | Yoshimi et al. | |
| 2012/0168822 A1 | 7/2012 | Matsushita | |
| 2013/0048939 A1 | 2/2013 | Zhang et al. | |

OTHER PUBLICATIONS

Xu et al., "Epitaxial condition and polarity in GaN grown on a HfN-buffered Si(111) wafer," Appl. Phys. Lett., 86, 182104 (2005).
Liu et al., "Epitaxy of Al films on GaN studied by reflection high-energy electron diffraction and atomic force microscopy," Appl. Phys. Lett., 70, 8, 24, 990 (1997).
Armitage et al., "Characterization of ZrB2(0001) surface prepared by ex situ HF solution treatment toward applications as a substrate for GaN growth," Surface Science, 600, 1439 (2006).
International Preliminary Report on Patentability issued by International Bureau of WIPO in PCT/US2015/042820 (dated Feb. 16, 2017).

* cited by examiner

EPITAXIAL METALLIC TRANSITION METAL NITRIDE LAYERS FOR COMPOUND SEMICONDUCTOR DEVICES

PRIORITY CLAIM

The present application is a non-provisional application claiming the benefit of U.S. Provisional Application No. 62/031,901, filed on Aug. 1, 2014 by David J. Meyer et al., entitled "Epitaxial Metallic Transition Metal Nitride Layers for Compound Semiconductor Devices," the entire contents of which is incorporated herein by reference.

BACKGROUND OF THE INVENTION

Field of the Invention

The present invention relates to integrating epitaxial, metallic transition metal nitride layers within a compound semiconductor device structure.

Description of the Prior Art

The ability to incorporate an epitaxial metal within a semiconductor device structure has been of interest because of the wide range of applications that can benefit from such a unique structure due to the lower resistivity of metals compared to semiconductors, and the additional degree of freedom in band structure engineering compared to exclusively semiconductor-based heterostructures. Potential applications can include buried ohmic or Schottky contacts, interconnects, antennas, or ground planes. The epitaxial metal may also be used as a traditional surface ohmic or Schottky contact, which may provide enhanced electrical characteristics and reliability compared to traditional polycrystalline metal contacts. The ability to replace a highly doped n- or p-type semiconductor with a metal can be used to reduce series resistance in devices where the highly doped n- or p-type layer's primary function is to provide a low resistance path for the lateral transport of charge, and the high conductivity of the metal can reduce the depletion width at junctions. The band structure of metals can be utilized in unique heterostructure designs for electronic and optoelectronic devices through the formation of metal quantum wells for devices such as a metal-base transistor, resonant tunneling diode or transistor, or photon detector including those based on inter-subband transitions. The optical properties of metals such as reflectivity could be used as a buried mirror or cladding layer for optoelectronic devices. Additionally, buried metals may be used in novel plasmonic device structures. Multiple buried metal layers may be used depending on the application, i.e. to create metal/semiconductor superlattices.

The ability to incorporate an epitaxial metal layer within a semiconductor structure requires proper selection of a metal that is compatible with the adjacent semiconductor(s). The metal and semiconductor(s) must have a similar crystal structure and in-plane lattice constant to reduce defect formation at the metal/semiconductor interface and within overlying layers. Furthermore, the metal must be thermodynamically stable with the adjacent semiconductor(s) to prevent material intermixing and enable the formation of sharp metal/semiconductor interfaces. Finally, the metal must be able to be grown on the semiconductor (and the semiconductor on the metal) in a fashion that allows for smooth, continuous film coverage, i.e. 2D or planar layer-by-layer growth without agglomeration. Ideally the metal and semiconductor layers should be deposited in situ in order to maintain the integrity and composition of the material surfaces and interfaces.

Formation of epitaxial metal layers to numerous technologically relevant semiconductor material systems have been reported, including Si (U.S. Pat. No. 4,492,971 to Bean et al. (Jan. 8, 1985) and U.S. Pat. No. 5,010,037 to Lin et al. (Apr. 23, 1991)), Group III-As (U.S. Pat. No. 3,929,527 to Chang et al. (Dec. 30, 1975), U.S. Pat. No. 5,075,755 to Sands (Dec. 24, 1991), and Palmstrom et al., "Epitaxial growth of ErAs on (100) GaAs," Applied Physics Letters 35, 2608-2610 (1988)), and Group III-Sb (U.S. Pat. No. 5,449,561 to Golding et al. (Sep. 12, 1995)). Few reports of an epitaxial metal layer have been reported for SiC or III-Ns. These semiconductors are used in a variety of electronic and optoelectronic applications including high power electronics, high frequency transistors, light-emitting diodes, and lasers. The growth of III-N semiconductors is also commonly performed on SiC substrates due to the close lattice match and excellent thermal conductivity of SiC. The ability to incorporate metal layers in these semiconductors would increase current device performance and open up new avenues of device design.

A few methods have been reported for growing III-N materials on top of metals; however, these methods do not meet the criteria for forming epitaxial metal/semiconductor heterostructures. For example, AlN is commonly sputtered onto metal electrodes, such as Al, to fabricate acoustic resonators (U.S. Pat. No. 4,502,932 to Kline et al. (Mar. 5, 1985)). The AlN in this case is sputtered and contains many grain boundaries and is not suitable for many electronic applications. Liu and colleagues reported on the epitaxial growth of aluminum on GaN in 1997 (Liu et al., "Epitaxy of Al films on GaN studied by reflection high-energy electron diffraction and atomic force microscopy," Applied Physics Letters 70, 990 (1997)). Due to the low melting point of Al, the epitaxy was performed at 15° C. or 150° C.—temperatures far too low for high-quality semiconductor overgrowth. In another method, a Pt layer is deposited on a sapphire substrate followed by the growth of GaN or AN deposited by metalorganic vapor phase epitaxy (MOVPE) (U.S. Pat. No. 6,239,005 to Sumiya et al. (May 29, 2001)). Due to the different crystal structures between Pt and GaN, a thick GaN buffer layer is required in order to obtain the crystal quality needed for operation of the intended optoelectronic device. This precludes this method from being applied to many semiconductor device concepts, particularly forming metal quantum wells. Additionally, it has been predicted that Pt and GaN are not in thermodynamic stability at 600° C. (Mohney et al., "Estimated phase equilibria in the transition metal-Ga—N systems: consequences for electrical contacts to GaN," Journal of Electronic Materials 25, 812-817 (1996)), which is lower than typical growth and process temperatures for III-N materials and devices. A similar method utilizes a ZrN metal layer deposited by sputtering on a Si (111) substrate coated with a sputtered AlN layer (U.S. Patent Application US 2010/0176369 by Oliver et al. (Jul. 15, 2010)). Again, a thick GaN buffer layer is required to obtain device quality GaN due to the different crystal structures between ZrN (rocksalt) and GaN (wurtzite), creating defects at the interface and in the GaN. Similarly, HfN has been used as a buffer layer for growth of GaN on Si (111) (Xu et al., "Epitaxial condition and polarity in GaN grown on a HfN-buffered Si (111) wafer," Applied Physics Letters 86, 182104 (2005) and U.S. Pat. No. 6,929,867 to Armitage et al. (Aug. 16, 2005)) and for HfN/GaN superlattices (U.S. Patent Application 2013/0048939 by Zhang et al. (Feb. 28, 2013)). Again, the HfN layer is rocksalt, and creates defects and inversion domains in the subsequently deposited semiconductor. Multilayers of metallic TiN and GaN have been deposited using reactive pulsed laser deposition (Rawat et al., "Growth of TiN/GaN metal semiconductor multilayers by reactive pulsed laser deposition," *Journal of Applied Physics* 100, 064901 (2006)). In this case, TiN and GaN have different crystal structures, and while a superlattice was grown, the structure of the film was polycrystalline in nature with columnar grain growth, which is not suitable for many electronic and optoelectronic applications. In all cases above, the choice of metallic layer does not satisfy the aforementioned requirements for the formation of an epitaxial metal/semiconductor heterostructure. Recently there have been reports of epitaxial growth of GaN on metallic $ZrB_2$. While GaN and $ZrB_2$ have similar lattice constants and thermal conductivities, nucleation of GaN on ZrB2 is problematic due to the different chemical properties of the two materials (Armitage et al., "Characterization of $ZrB_2$ (0001) surface prepared by ex situ HF solution treatment toward applications as a substrate for GaN growth," *Surface Science* 600, 1439 (2006)), and control of the surface is critical because epitaxy will not occur if BN is present at the interface (Wang et al., "Effect of nitridation on the growth of GaN on ZrB2(0001)/Si(111) by molecular-beam epitaxy," *Journal of Applied Physics* 100, 033506 (2006)).

BRIEF SUMMARY OF THE INVENTION

The present invention provides a method for integrating epitaxial, metallic transition metal nitride (TMN) layers within a compound semiconductor device structure. The TMN layers have a similar crystal structure to relevant semiconductors of interest such as silicon carbide (SiC) and the Group III-Nitrides (III-Ns) such as gallium nitride (GaN), aluminum nitride (AlN), indium nitride (InN), and their various alloys. Additionally, the TMN layers have excellent thermal stability and can be deposited in situ with other semiconductor materials, allowing the TMN layers to be buried within the semiconductor device structure to create semiconductor/metal/semiconductor heterostructures and superlattices.

One advantage of this method is that it allows for the practical realization of epitaxial metal/semiconductor heterostructures, which to date have not been possible using III-N or SiC semiconductors due to different crystal structures between the metal and the semiconductor and/or lack of thermal stability or chemical incompatibility between the metal and semiconductor. Previously reported integration of III-Ns and metal layers have all produced inferior, polycrystalline III-N semiconductor layers that are not viable for certain electronic device applications. This method provides a way to achieve single-crystal heterostructures not realizable by previous methods. Epitaxial growth of III-N semiconductor layers on SiC substrates is well understood. Simply by changing the group III atom to a transition metal (TM) at the interface greatly reduces the complications in surface chemistry that can occur in other III-N/metal heterointerfaces like the GaN/$ZrB_2$ system or others involving different chemical compounds in the substrate.

These and other features and advantages of the invention, as well as the invention itself, will become better understood by reference to the following detailed description, appended claims, and accompanying drawings.

DETAILED DESCRIPTION OF THE INVENTION

Figure 1:
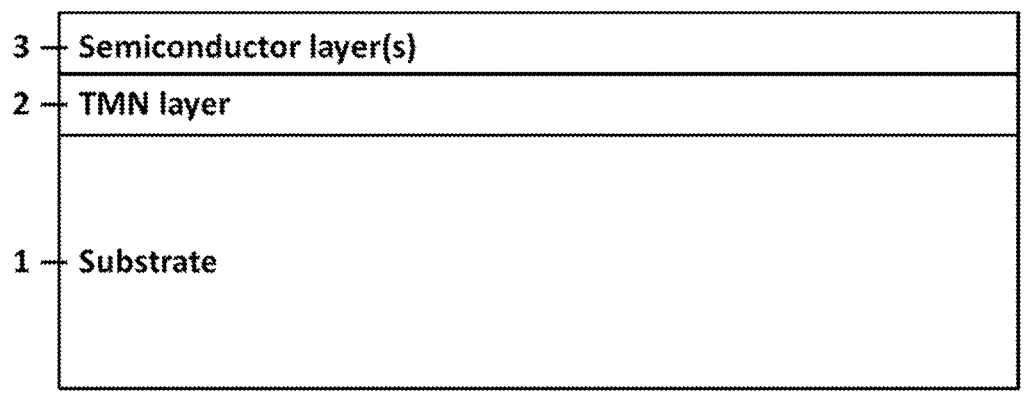
FIG. 1 is a cross-sectional schematic of a substrate with a TMN metallic layer buried beneath semiconductor layer(s).

The best mode for this invention involves using a transition metal nitride (TMN) 2 as the epitaxial metal layer in the semiconductor device structure as shown in FIG. 1. In particular, both tantalum nitride ($Ta_2N$) and niobium nitride ($Nb_2N$) possess the necessary properties for a stable, epitaxial relationship with SiC and the III-N semiconductors. The crystal structure of $Ta_2N$, $Nb_2N$, and the commonly-used 4H or 6H polytypes of SiC is hexagonal, and the in-plane lattice constants, a, are similar, where $a_{SiC}$=3.073 Å, $a_{Ta2N}$=3.041 Å, and $a_{Nb2N}$=3.05 Å. The III-N semiconductors, GaN and AlN, also have similar crystal structures and in-plane lattice constants compared to $Ta_2N$ and $Nb_2N$. The crystal structure of GaN and AlN is wurtzite with $a_{GaN}$=3.189 Å and $a_{AlN}$=3.112 Å, and these materials are commonly grown on 4H— or 6H—SiC substrates due to their similar crystal structures and in-plane lattice constants. Based on the heat of formation and the high melting points of $Ta_2N$ and $Nb_2N$ (>2500° C.), these materials are expected to maintain thermodynamic stability with SiC, AlN, or GaN at typical growth temperatures for most commonly-used growth methods, such as molecular beam epitaxy (MBE), metal organic vapor phase epitaxy (MOVPE), atomic layer epitaxy (ALE), sputtering, etc., which do not typically exceed 1200° C. Additionally, the high melting points of $Ta_2N$ and $Nb_2N$ suppress the potential for agglomeration of very thin metal films at typical growth temperatures.

While the TMN metal layer 2 can be grown by a variety of known methods, it is best if the TMN 2 is grown in situ with the subsequently grown semiconductor layer(s) 3 to prevent surface contamination or oxidation. For example, if the semiconductor layer(s) 3 were grown via MBE, it would be best to grow the TMN layer 2 in the same growth chamber just prior. This could be accomplished by using an electron-beam (e-beam) evaporated transition metal source and nitrogen plasma. Typical TM fluxes can be in the 0.001 nm/s-1.0 nm/s range with a preferred range of 0.01 nm/s-0.1 nm/s. Typical reactive nitrogen fluxes can be in the 0.001 to 10.0 nm/s range with a preferred range of 0.01-0.1 nm/s. The incident fluxes and the substrate temperature control the TMN phase, so the fluxes must be chosen using standard techniques to create the desired phase. The MBE deposition process consists of setting the appropriate operating conditions for the e-beam source in the 3 kV-10 kV operating voltage range and emission currents in the 50 mA-1000 mA range with a preferred range of 8 kV-10 kV and 100 mA-500 mA, respectively. Similarly, the reactive nitrogen can be generated using a variety of sources including ammonia, RF plasma sources, ECR plasma sources, cold-cathode discharge sources, laser-based excitation sources, and others. The preferred source is an RF plasma source using pure nitrogen gas as the feed source. Operating conditions of the RF plasma source will depend on the specific characteristics of the source, the exit aperture geometry, and the source-to-substrate distance, but typically are in the range of 0.01 sccm-20 sccm and RF powers of 50 W-600 W with a preferred range of 0.1 sccm-10 sccm and 100 W-500 W. The crystal phase of the TMN can be controlled through suitable choice of the substrate temperature during MBE growth and through the control of the TM and reactive nitrogen flux magnitudes and ratios to ensure the appropriate stoichiometry. Substrate temperature for TMN epitaxy can be in the range of 25° C.-1500° C. with preferred temperature range being 300° C.-1200° C. depending on the substrate and particular phase of interest and other relevant constraints that may be present (e.g. substrate and overlayer compatibility). Epitaxial growth commences in the standard way—the TM and reactive nitrogen source shutters can be opened simultaneously, or the substrate can be exposed to a controlled reactive nitrogen or TM dose before opening the other shutter to begin growth. The preferred method is to open the shutters simultaneously. In-situ reflection high-energy electron diffraction (RHEED) can be used in the typical way to monitor the growth and determine the crystal phase through measurement of the RHEED streak spacing in the standard way. Prior to TMN 2 growth, the substrate 1 should receive typical cleaning and pretreatment steps. The semiconductor layer(s) 3 are not limited to any particular material system; however, this technique would be aptly suited for growth of epitaxial device structures using the III-N material system, which are commonly grown on SiC substrates. The polarity of the hexagonal III-N film grown epitaxially on the TMN layer can be controlled by the use of appropriate "nucleation" layers on the TMN film in analogy with GaN grown on $ZrB_2$ by MBE and GaN grown on sapphire by MOVPE. Without any nucleation layer on the TMN layer, the III-N layer is typically N-polar as grown by MBE.

Figure 2:
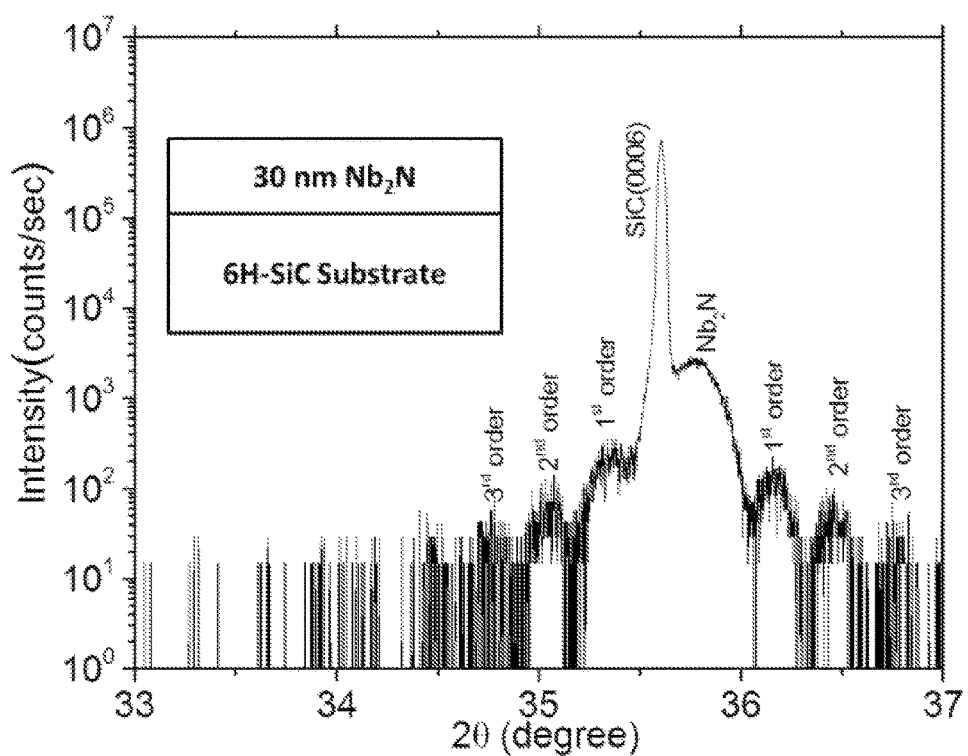
FIG. 2 shows XRD data showing a single phase 30 nm $Nb_2N$ film grown on a 6H—SiC substrate.
Figure 3:
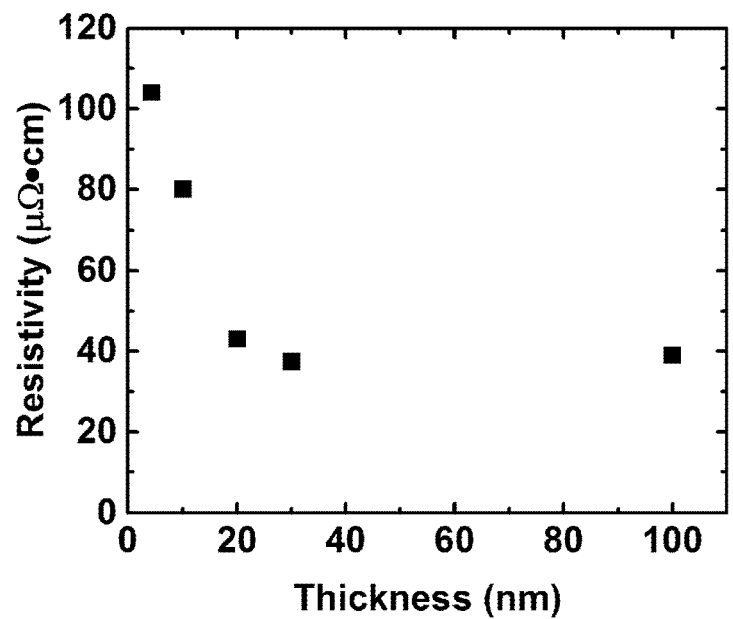
FIG. 3 shows the resistivity of varying thickness of $Nb_2N$ films grown on 6H—SiC substrates.
Figure 4:
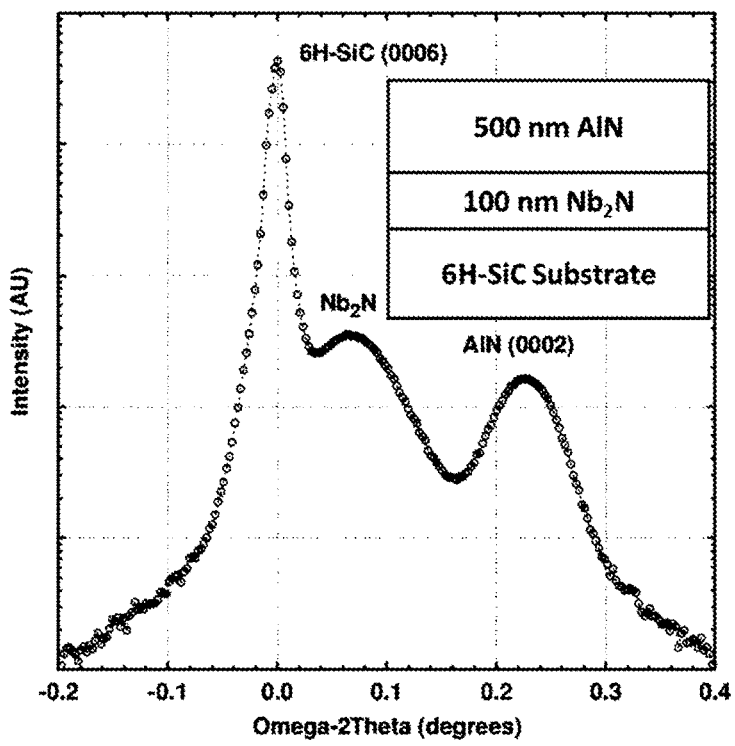
FIG. 4 shows XRD data showing high quality material of AlN/$Nb_2N$ structure grown on a 6H—SiC substrate.
Figure 5:
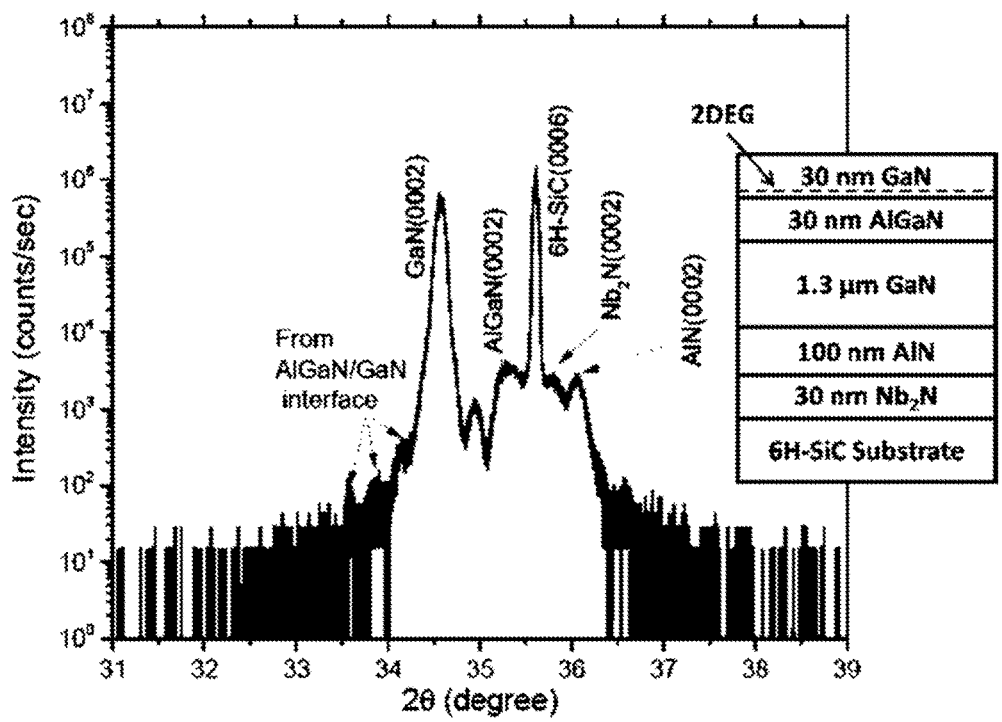
FIG. 5 shows XRD data showing high quality material of HEMT/$Nb_2N$ structure grown on a 6H—SiC substrate.

This technique has been experimentally demonstrated using MBE growth of $Nb_2N$ and various III-N semiconducting 3 layers grown on a 6H—SiC substrate 1. In the first example, a single phase, hexagonal $Nb_2N$ film 2 with a thickness of 30 nm was grown on the Si-face of a 6H—SiC substrate 1. The X-ray diffraction (XRD) data in FIG. 2 shows that a high quality, single phase $Nb_2N$ layer was achieved. The sheet resistance of the 30 nm $Nb_2N$ layer was measured to be 12.5 $\Omega$/sq., giving a metallic resistivity of 37.5 $\mu\Omega\cdot$cm. The 30 nm $Nb_2N$ layer had a root-mean-squared (RMS) roughness of 0.59 nm as measured by atomic force microscopy (AFM). The plot in FIG. 3 demonstrates that the epitaxial $Nb_2N$ layers remain conductive to at least a thickness of 4.4 nm, demonstrating that the film is still continuous. In addition to the low resistivity, the 4.4 nm $Nb_2N$ film is smooth with a RMS roughness of 0.12 nm as measured by AFM, and could be used in electronic and optoelectronic applications where very thin metallic layers would be advantageous. After the desired thickness of the $Nb_2N$ 2 is obtained, the semiconductor layer(s) 3 can subsequently be grown under typical growth conditions in the MBE. In a second example, a structure similar to FIG. 1 is grown, but with a 500 nm AlN layer 3 grown on top of a 100 nm $Nb_2N$ layer 2 on a 6H—SiC substrate 1. The XRD data in FIG. 4 shows a single crystal $Nb_2N$ layer 2 and AlN layer 3, with a full-width at half-maximum for the AlN layer of 200 arcsec. The sheet resistance of the $Nb_2N$ remains conductive with a value of 4.0 $\Omega$/sq. or 40 $\mu\Omega\cdot$cm, retaining its functionality as a potential buried electrode. In a third example, semiconductor layers 3 forming a III-N high-electron-mobility transistor (HEMT) structure were deposited via MBE in situ after depositing a 30 nm $Nb_2N$ layer 2 on a 6H—SiC substrate 1. As shown in FIG. 5, the III-N semiconductor layers 3 consisted of a 100 nm AlN nucleation layer grown on top of the $Nb_2N$ layer 2 followed by a 1.3 $\mu$m GaN buffer layer, a 30 nm AlGaN barrier layer with a 40% Al fraction, and a 30 nm GaN channel. The III-N layers 3 grown on top of the $Nb_2N$ layer 2 are N-polar, so the two-dimensional electron gas (2 DEG) channel is located at the 30 nm AlGaN/30 nm GaN interface as shown in FIG. 5. The XRD data in FIG. 5 shows the high material quality of each layer of the HEMT/$Nb_2N$/6H—SiC structure. Transport properties of the HEMT sample in FIG. 5 were quantified using Hall Effect measurements. The mobility, sheet resistance, and carrier concentration of the 2 DEG were measured to be 1375 $cm^2$/V·s, 385 $\Omega$/sq., and $1.18\times10^{13}$ $cm^{-2}$, respectively. These values are comparable to transport properties of similar HEMT structures grown directly on 6H—SiC and demonstrate that high quality III-N materials can be grown on $Nb_2N$. Additionally, the 30 nm $Nb_2N$ layer 2 remains conductive with a sheet resistance of 15.7 $\Omega$/sq after III-N device layer 3 growth.

Other metallic TMN layers may also include $TaN_x$, $NbN_x$, $WN_x$, or $MoN_x$ or any TMN ternary compound that have hexagonal crystalline phases with lattice constants close to that of hexagonal SiC or hexagonal III-N semiconductors. In addition, metallic TMN layers having cubic symmetry can be nearly lattice matched to 3C—SiC and cubic III-N semiconductors. For example, the cubic $\delta$-NbNx phase (Fm3m space group, a=0.43811) and the cubic $\epsilon'$-$TaN_x$ phase (Fm3m space group, a=0.435 nm) are closely lattice-matched to 3C—SiC and GaN, so the ideas and claims in this patent application for hexagonal TMNs, SiC, and III-Ns can be readily extended to cubic phases of the TMNs, SiC and III-N materials. The substrate is also not limited to SiC, but may also include silicon, GaN, AlN, sapphire, or any other technologically relevant substrate.

Figure 6:
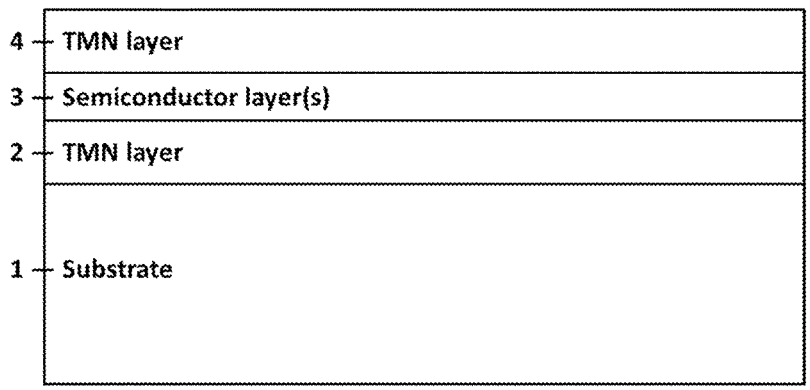
FIG. 6 shows a cross-sectional schematic of a device structure with multiple TMN layers.
Figure 7:
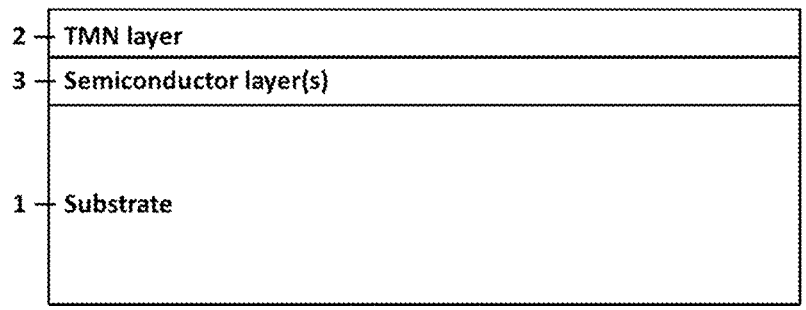
FIG. 7 shows a cross-sectional schematic of a device structure with TMN layer grown on top.
Figure 8:
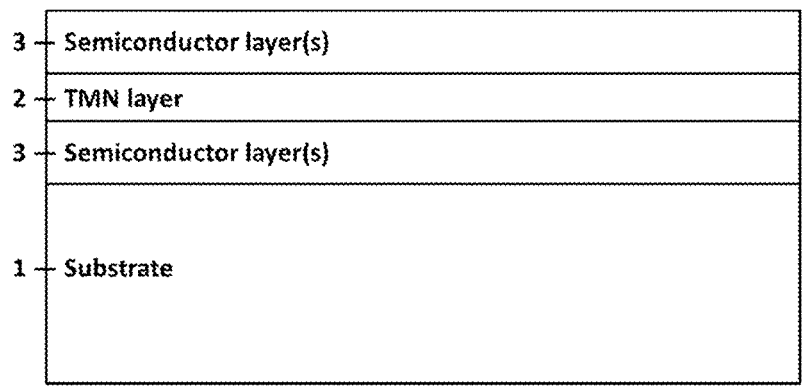
FIG. 8 shows a cross-sectional schematic of a device with a semiconductor/TMN/semiconductor structure.
Figure 9:
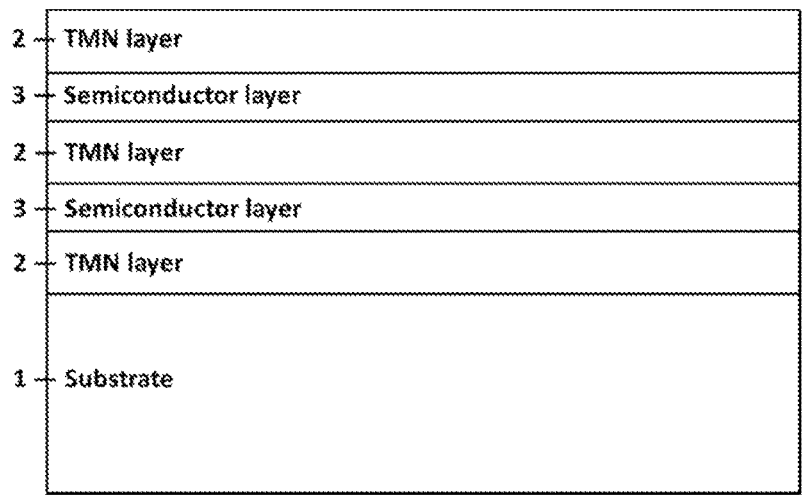
FIG. 9 shows a cross-sectional schematic of a device structure with multiple TMN/semiconductor layers.

The device structure design is not limited by just growing the TMN layer 2 on a substrate followed by the semiconductor layer(s) 3. The TMN layer(s) and semiconductor layer(s) can be grown in any way that is required or advantageous for the specific device design. This may include having multiple TMN layers that may have different compositions, such as one layer of $Nb_2N$ 2 and a separate layer of $Ta_2N$ 4 within a structure, as shown in FIG. 6, where the electronic properties of the TMN/semiconductor interfaces may be different for each TMN layer. The TMN layer 2 may be grown on the surface of the semiconductor layer(s) 3 to act as an in situ grown, epitaxial ohmic or Schottky contact, as shown in FIG. 7. Another example could include a semiconductor 3/TMN layer 2/semiconductor 3 structure for use as a metal-base transistor, as shown in FIG. 8. An additional example is a multi-layer semiconductor 3/TMN 2 structure to form metal quantum wells, as shown in FIG. 9.

The TMN and semiconductor layer(s) growth method is not limited to MBE and may be deposited by any known growth method, such as sputtering, pulsed laser deposition, atomic layer epitaxy (ALE), or MOVPE. While depositing all the layers in situ or in vacuo is preferred, layers may be deposited ex situ as long as proper cleaning of the surface is performed prior to growing the subsequent layer to achieve a native oxide-free, contaminant-free surface for further growth.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method for integrating epitaxial metallic transition metal nitride (TMN) layers within a semiconductor device, comprising:
   providing a substrate;
   growing an epitaxial metal layer selected from the group consisting of $TaN_x$, $NbN_x$, $WN_x$, $MoN_x$, TMN ternary compounds, and combinations thereof; and
   growing at least one epitaxial semiconductor layer comprising a semiconductor material selected from the group consisting of SiC or AlN;
   wherein the in-plane lattice constants of the substrate, the epitaxial metal layer, and the epitaxial semiconductor layer are all within 2% of one another; and
   wherein the epitaxial metal layer is grown directly on the substrate and the at least one epitaxial semiconductor layer is grown directly on the epitaxial metal layer to form an epitaxial metal/semiconductor heterostructure, or the at least one epitaxial semiconductor layer is grown directly on the substrate and the epitaxial metal layer is grown directly on the at least one epitaxial semiconductor layer to form an epitaxial metal/semiconductor heterostructure.

2. The method of claim 1, wherein the epitaxial metal layer and the at least one epitaxial semiconductor layer are grown in situ.

3. The method of claim 1, wherein the epitaxial metal layer is selected from the group consisting of $Ta_2N$, $Nb_2N$, and combinations thereof.

4. The method of claim 1, wherein the substrate is selected from the group consisting of SiC, GaN, AlN, and combinations thereof.

5. The method of claim 1, additionally comprising a second epitaxial metal layer on top of the at least one epitaxial semiconductor layer, wherein the second epitaxial metal layer may be of different material composition or stoichiometry from the epitaxial metal layer.

6. The method of claim 1, additionally comprising additional multiple layers of epitaxial metal layers and epitaxial semiconductor layers, wherein the additional layers may be of different material composition or stoichiometry.

7. The method of claim 1, wherein the epitaxial metal layer and epitaxial semiconductor layer have hexagonal crystal structures.

8. The method of claim 1, wherein the epitaxial metal/semiconductor heterostructure is selected from the group consisting of a buried contact, a quantum well, a buried mirror, a cladding layer, and a superlattice.

9. A semiconductor device, comprising:
   a substrate;
   an epitaxial metal layer selected from the group consisting of $TaN_x$, $NbN_x$, $WN_x$, $MoN_x$, TMN ternary compounds, and combinations thereof; and
   at least one epitaxial semiconductor layer comprising a semiconductor material selected from the group consisting of SiC or AlN;
   wherein the in-plane lattice constants of the substrate, the epitaxial metal layer, and the epitaxial semiconductor layer are within 2% of one another; and
   wherein the epitaxial metal layer is in direct contact with the substrate and the at least one epitaxial semiconductor layer is in direct contact with the epitaxial metal layer to form an epitaxial metal/semiconductor heterostructure, or the at least one epitaxial semiconductor layer is in direct contact with the substrate and the epitaxial metal layer is in direct contact with the at least one epitaxial semiconductor layer to form an epitaxial metal/semiconductor heterostructure.

10. The semiconductor device of claim 9, wherein the epitaxial metal layer and the at least one epitaxial semiconductor layer are grown in situ.

11. The semiconductor device of claim 9, wherein the epitaxial metal layer is selected from the group consisting of $Ta_2N$, $Nb_2N$, and combinations thereof.

12. The semiconductor device of claim 9, wherein the substrate is selected from the group consisting of SiC, GaN, AlN, and combinations thereof.

13. The semiconductor device of claim 9, additionally comprising a second epitaxial metal layer on top of the at least one epitaxial semiconductor layer, wherein the second epitaxial metal layer may be of different material composition or stoichiometry from the epitaxial metal layer.

14. The semiconductor device of claim 9, additionally comprising additional multiple layers of epitaxial metal layers and epitaxial semiconductor layers, wherein the additional layers may be of different material composition or stoichiometry.

15. The semiconductor device of claim 9, wherein the epitaxial metal layer and epitaxial semiconductor layer have hexagonal crystal structures.

16. The semiconductor device of claim 9, wherein the epitaxial metal/semiconductor heterostructure is selected from the group consisting of a buried contact, a quantum well, a buried mirror, a cladding layer, and a superlattice.

* * * * *